(12) United States Patent
Wakamatsu et al.

(10) Patent No.: US 6,940,316 B2
(45) Date of Patent: Sep. 6, 2005

(54) COMPARATOR CIRCUIT

(75) Inventors: Takeshi Wakamatsu, Saitama (JP); Shigemitsu Horikawa, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/807,184

(22) Filed: Mar. 24, 2004

(65) Prior Publication Data
US 2005/0104626 A1 May 19, 2005

(30) Foreign Application Priority Data
Nov. 19, 2003 (JP) .............................. 2003-389484

(51) Int. Cl.[7] .......................... G01R 19/00; G11C 7/00
(52) U.S. Cl. ........................................ 327/57; 327/64
(58) Field of Search ........................ 327/51–57, 63–66, 327/76–83, 85, 89–90, 97, 266, 274, 280, 327/287, 560–563; 365/205–207

(56) References Cited

U.S. PATENT DOCUMENTS

| | | | | |
|---|---|---|---|---|
| 5,668,765 A | * | 9/1997 | Ang | 365/205 |
| 5,696,724 A | * | 12/1997 | Koh et al. | 365/205 |
| 5,901,087 A | * | 5/1999 | Pascucci | 365/185.21 |
| 6,008,673 A | * | 12/1999 | Glass et al. | 327/77 |
| 6,462,590 B2 | * | 10/2002 | Warwar | 327/108 |
| 6,788,112 B1 | * | 9/2004 | Chan et al. | 327/51 |
| 6,833,739 B2 | * | 12/2004 | Isoda | 327/108 |

FOREIGN PATENT DOCUMENTS

| | | |
|---|---|---|
| JP | 05-67950 | 9/1993 |
| JP | 2002-237743 | 8/2002 |

* cited by examiner

Primary Examiner—My-Trang Nu Ton
(74) Attorney, Agent, or Firm—Nixon Peabody LLP; Donald R. Studebaker

(57) ABSTRACT

In order to provide a comparator circuit without generating a malfunction, the comparator circuit according to the present invention may comprise a comparator circuit including a differential amplification circuit having a differential pair transistor (M1, M2) for inputting a signal as an object of comparison, and a current mirror load circuit (M3, M4, M5, M6); a latch circuit having inversion amplifiers that are configured so that an input of one amplifier becomes an input of other amplifier so as to amplify a differential output signal outputted from the current mirror load circuit in accordance with a magnitude relation of the signal as an object of comparison; an equalization transistor (M9) for equalizing a signal of the differential amplification circuit; a delay circuit (M13, M14, M15, M16) for generating a signal to delay a control signal to be inputted in a control electrode of the equalization transistor; and a control transistor (M10) for inputting an output signal of the delay circuit in the control electrode as a control signal to make the latch circuit into an active status and a non-active status.

8 Claims, 5 Drawing Sheets

COMPARATOR CIRCUIT

BACKGROUND OF THE INVENTION

1. Field of the Invention

The present invention relates to a high-speed and high-precision comparator circuit for comparing two small signals at a high speed and outputting a digital value according to a magnitude relation of these signals in a high-speed A/D capacitor or the like.

2. Description of the Related Art

As a comparator circuit used for an A/D capacitor or the like, one configured by an amplifier and a latch circuit for outputting a digital value in synchronization with a clock signal has been known. FIG. 1A shows an example of such a conventional comparator circuit. The comparator circuit shown in this drawing is configured by connecting a differential amplifier circuit having NMOS transistors M1, M2 and a current mirror load circuit composed of PMOS transistors M3, M4, M5, M6 to a latch circuit configured by two inversion amplifiers (invertors) that are connected so that an input of one amplifier is made into an output of other amplifier.

Two inversion amplifiers are configured by a NMOS transistor M7 and a PMOS transistor M11, and a NMOS transistor M8 and a PMOS transistor M12, respectively. In addition, the inversion amplifiers are provided with a NMOS transistor M9 for equalizing output signals OUTP and OUTN, and a transistor M10 for operating the inversion amplifiers in synchronization with a clock signal CLK.

In the differential amplifier circuit having the current mirror circuit, a source of the transistors M1 and M2 is connected to a power source 11, and two input signals INP and INN are applied to gates of the transistors M1 and M2, respectively. To drains of the transistors M1 and M2, drains and gates of the transistors M3 and M4, and gates of the transistors M5 and M6 are respectively connected. Sources of the transistors M3, M4, M5 and M6 are connected to a supply voltage VDD, respectively, and the drains of the transistors M5 and M6 are connected to the inputs and the outputs of the inversion amplifier (inverter).

In the latch circuit configured by two inversion amplifiers, a transistor M9 is connected between the output terminals OUTP and OUTN, and the clock signal CLK is applied to a gate of the transistor M9. When this clock signal CLK is at a High level, the transistor M9 turns the power on, and the output terminals OUTP and OUTN are equalized. At the same time, the clock signal CLK is applied to a gate of a transistor M10 to make the transistor M10 non-conductive. As a result, the latch circuit is made into a non-active status.

A source of the transistors M7 and M8 is connected to an earth potential, and a gate of the transistor M7 is connected to a drain of the transistor M8 and the output terminal OUTP. In addition, a gate of the transistor 8 is connected to a drain of the transistor M7 and the output terminal OUTN. A source of a transistor M10 is connected to the supply voltage VDD, and a drain thereof is connected to a source of transistors M11 and M12. Gates of transistors M11 and M12 are connected to the output terminals OUTP and OUTN, respectively; and drains thereof are connected to the output terminals OUTP and OUTN, respectively.

The operation of a conventional comparator circuit will be described below.

When the clock signal CLK is at the High level, if the transistor M9 turns the power on, the output terminals OUTP and OUTN are equalized to the equal potential. At the same time, two input signals INP and INN are applied to the gates of the transistors M1 and M2 since the transistor M10 is made into the non-conductive status, however, an input signal is not differentially amplified due to the differential amplifier circuit having the current mirror load circuit since the output terminals OUTP and OUTN are equalized to the equal potential.

Next, if the clock signal CLK transits to a Low level, the transistor M9 is made into a non-active status, a potential difference between the input signals INP and INN that are applied to the transistors M1 and M2 is slightly amplified in the differential amplifier circuit having the current mirror load circuit to be outputted to the output terminals OUTP and OUTN. At the same time, the transistor M10 is made into a conductive status, the latch circuit configured by two inversion amplifiers configured by the transistors M7 and M11, and the transistors M8 and M12 is operated (activated), the small potential difference between the output terminals OUTP and OUTN amplified by the differential amplifier circuit having the current mirror load circuit is rapidly enlarged and amplified to a degree of the supply voltage or the earth potential level, and this amplified voltage is held in the output terminals OUTP and OUTN (see FIG. 1B).

For example, this sort of comparator circuit is disclosed in JP-A-5-67950 and JP-A-202-23774.

In the above-described comparator circuit, the voltage levels of the output terminals OUTP and OUTN should be decided by the magnitude relation between the input signals INP and INN at a leading edge of the clock signal CLK, however, when the potential difference of the input signals INP and INN is small, the potential difference of the output terminals OUTP and OUTN is rapidly changed due to the amplification operation of the latch circuit, and this results in returning of the voltage change in the output terminals OUTP and OUTN to the side of the input signals INP and INN due to a parasitic capacitance (C1gd, C2gd, C5gd, C6gd) between the gate and the drain of the transistors M1, M5, and M2, M6. Therefore, this involves a problem such that a so-called kickback phenomenon, in which the voltage relation between the input signals INP and INN is inversed, occurs and then, a malfunction may occur.

In addition, wiring resistance and wiring capacitance from the drain of the transistor M5 to the drains of the transistors M8 and M12, and the gates of the transistors M7, M11 may be slightly different from those from the drain (or the source) of the transistor M9 and the drain of the transistor M6 to the drains of the transistors M7, M11 and the gates of the transistors M8, M12. Therefore, in the event of deciding the magnitude relation of the input signals INP and INN having the small voltage difference, a small difference is generated in the speed of the voltage level change of the output terminals OUTP and OUTN by the amplifier having the current mirror load. In the conventional comparator circuit shown in FIG. 1A, the amplification operation is started by the latch circuit at the same time as the amplification operation by the differential amplifier having the current mirror load, and this involves a problem such that, under the condition that the voltage level amplified by the differential amplifier having the current mirror load is not determined, a wrong voltage level is held if the voltage level is rapidly amplified.

SUMMARY OF THE INVENTION

In order to provide a comparator circuit without generating a malfunction, the comparator circuit according to the present invention may comprise a comparator circuit including: a differential amplification circuit having a differential pair transistor for inputting a signal as an object of comparison, and a current mirror load circuit; a latch circuit having inversion amplifiers that are configured so that an input of one amplifier becomes an input of other amplifier so as to amplify a differential output signal outputted from the current mirror load circuit in accordance with a magnitude relation of the signal as an object of comparison; an equalization transistor for equalizing a signal of the differential amplification circuit; a delay circuit for generating a signal to delay a control signal to be inputted in a control electrode of the equalization transistor; and a control transistor for inputting an output signal of the delay circuit in the control electrode as a control signal to make the latch circuit into an active status and a non-active status.

DESCRIPTION OF THE PREFERRED EMBODIMENTS

Figure 1A:
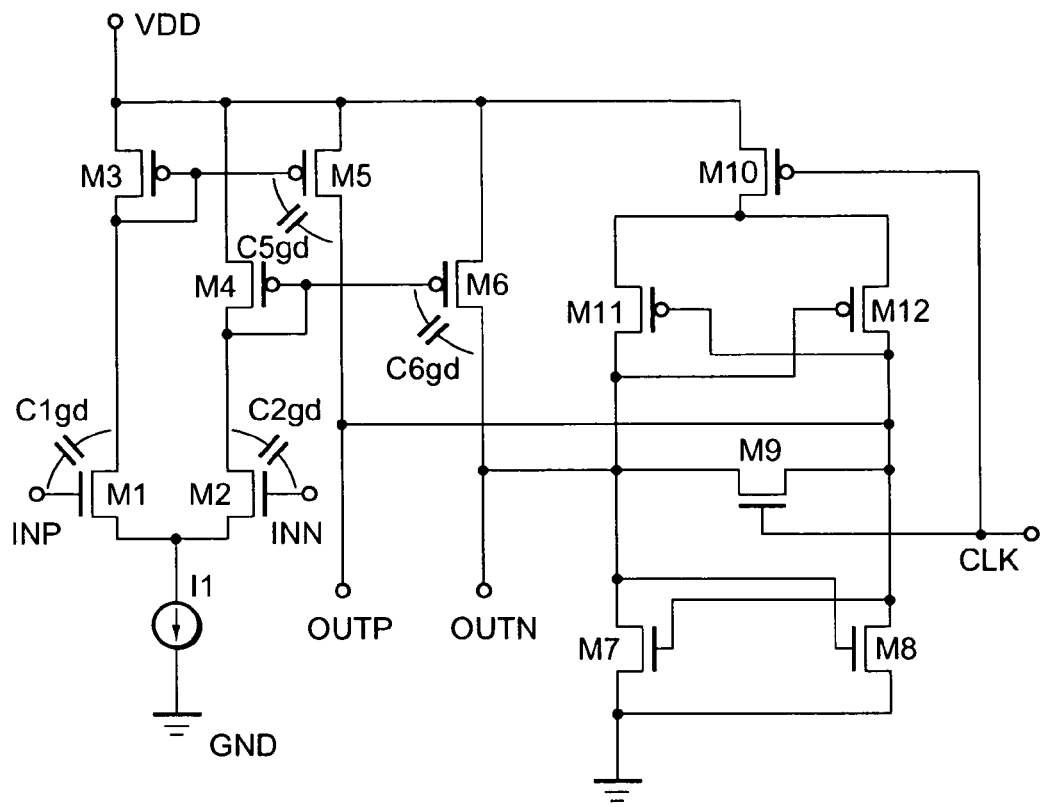
FIG. 1A is a circuit diagram showing an example of a conventional comparator circuit.
Figure 1B:
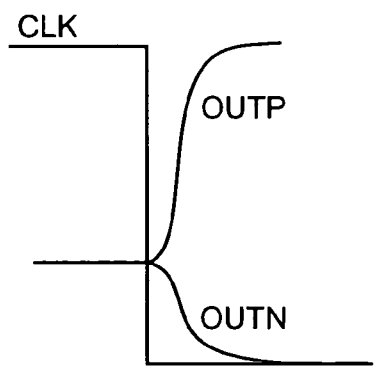
FIG. 1B is a wave form chart showing a relation between a CLK signal and an output signal in the circuit shown in FIG. 1A.

The embodiments showing the best mode of the present invention will be described below with reference to the drawings. In the drawings, the sizes, the figures, and the configurational relation of respective components are schematically depicted to a degree that the present invention can be appreciated. In addition, to the identical components, the identical reference numerals are given and the duplicate explanations are herein omitted.

First Embodiment

Figure 2:
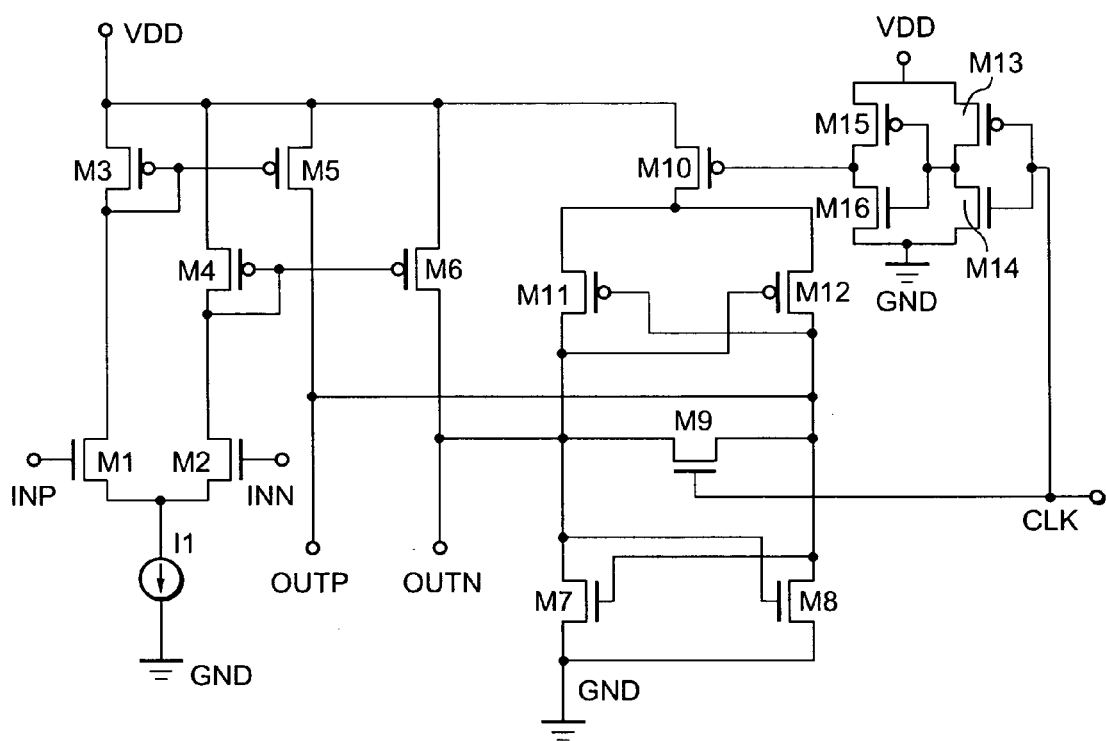
FIG. 2 is a circuit diagram showing a first embodiment of a comparator circuit according to the present invention.

FIG. 2 is a circuit diagram showing a first embodiment of a comparator circuit according to the present invention. The comparator circuit in this embodiment is configured by connecting a differential amplifier circuit having NMOS transistors M1, M2 and a current mirror load circuit composed of PMOS transistors M3, M4, M5, M6 to a latch circuit configured by two inversion amplifiers (invertors) that are connected so that an input of one amplifier is made into an output of other amplifier.

Two inversion amplifiers are configured by a NMOS transistor M7 and a PMOS transistor M11; and a NMOS transistor M8 and a PMOS transistor M12, respectively. In addition, the inversion amplifiers are provided with a NMOS transistor M9 for equalizing output signals OUTP and OUTN, and a transistor M10 for operating the inversion amplifiers in synchronization with the delayed clock signal.

In order to apply the delayed clock signal CLK to the gate of the transistor M10, according to the present embodiment, a first inverter circuit configured by the PMOS transistor M13 and the NMOS transistor M14, and a second inverter circuit configured by the PMOS transistor M15 and the NMOS transistor M16 are connected in series; and an output signal of the second inverter circuit is inputted in the gate of the transistor M10.

In the differential amplifier circuit having the current mirror circuit, a source of the transistors M1 and M2 is connected to a power source 11, and two input signals INP and INN are applied to gate electrodes of the transistors M1 and M2, respectively. To drains of the transistors M1 and M2, drains and gates of the transistors M3 and M4, and gates of the transistors M5 and M6 are respectively connected. Source electrodes of the transistors M3, M4, M5 and M6 are connected to a supply voltage VDD, respectively, and the drains of the transistors M5 and M6 are connected to the inputs and the outputs of the inversion amplifier (inverter).

In the latch circuit configured by two inversion amplifiers, a transistor M9 is connected between the output terminals OUTP and OUTN, and the clock signal CLK is applied to a gate electrode of the transistor M9. A source electrode of the transistors M7 and M8 is connected to the earth potential, a gate electrode of the transistor M7 is connected to a drain electrode of the transistor M8 and the output terminal OUTP, and a gate electrode of the transistor M8 is connected to a drain electrode of the transistor M7 and the output terminal OUTN.

A source electrode of the transistor M10 is connected to the supply voltage VDD, and a drain electrode thereof is connected to a source electrode of the transistors M11 and M12. Gate electrodes of the transistors M11 and M12 are connected to the output terminals OUTP and OUTN, respectively, and drain electrodes thereof are connected to OUTP and OUTN, respectively.

To gate electrodes of the transistors M13 and M14 composing one inverter of the dual inverter, the clock signal CLK is applied. A source electrode of the transistor M13 is connected to the supply voltage VDD, the drain electrode thereof is connected to a drain electrode of the transistor M14 and a gate electrode of the transistors M15 and M16 composing other inverter. A source electrode of the transistor M14 is connected to the earth potential together with a source electrode of the transistor M16.

A source electrode of the transistor M15 composing other inverter of the dual inverter is connected to the supply voltage VDD, and drain electrodes of the transistors M15 and M16 are connected to a gate electrode of the transistor M10.

The operation of the circuit shown in FIG. 2 will be described below.

At first, when the clock signal CLK is at the High level and the transistor M9 turns the power on, the output terminals OUTP and OUTN are equalized to the equal potential. At the same time, the inverter configured by the transistors M13 and M14 may operate, and consequently, the inverter configured by the transistors M15 and M16 may operate. Thereby, the transistor M10 is made into a non-conductive status behind.

Two input signals INP and INN are applied to the gates of the transistors M1 and M2, however, an input signal is not differentially amplified due to the differential amplifier circuit having the current mirror load circuit since the transistor M9 turns the power on and the output terminals OUTP and OUTN are equalized to the equal potential.

Next, if the clock signal CLK transits to a Low level, the transistor M9 is made into a non-active status, a potential difference between the input signals INP and INN that are applied to the transistors M1 and M2 is slightly amplified in the differential amplifier circuit having the current mirror load circuit to be outputted to the output terminals OUTP and OUTN. In addition, the amplification operation is slightly performed by the transistors M7 and M8.

The transistor M10 is made into a conductive status behind due to delay of the clock signal CLK by the dual inverter, and this delay time makes a potential level of the output terminals OUTP and OUTN amplified by the differential amplifier having the current mirror load and the transistors M7 and M8 stable. However, a time till the potential level is stable is different depending on a potential difference of the input signals INP and INN and a driving ability of the differential amplifier having the current mirror load.

Under this state, the latch circuit configured by two inversion amplifiers configured by the transistors M7 and M11, and the transistors M8 and M12 is operated, the small potential difference between the output terminals, which is amplified by the differential amplifier circuit having the current mirror load circuit, is rapidly amplified, and the potential of the output terminals OUTP and OUTN is held in the supply voltage VDD or the earth potential.

As described above, in the comparator circuit according to the first embodiment, by applying the clock signal CLK that is delayed by the dual inverter circuit configured by the transistors M13 and M14, and the transistors M15 and M16 to the gate electrode of the transistor M10, it is possible to secure a time for making the voltage level amplified by the amplification operation by the differential amplifier having the current mirror load stable, and the simultaneous amplification operation by the differential amplifier having the current mirror load and the latch circuit can be evaded. This results in improvement of determination accuracy by providing a small delay circuit, so that a circuit does not become large in size.

Second Embodiment

Figure 3:
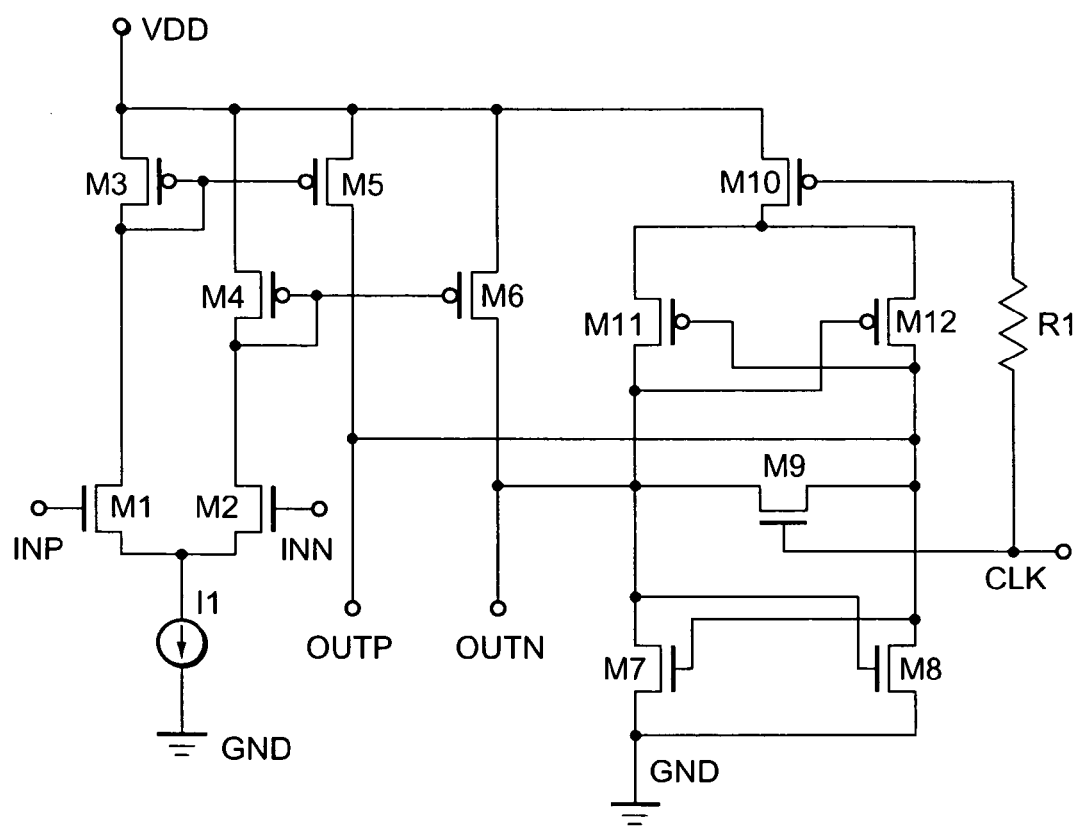
FIG. 3 is a circuit diagram showing a second embodiment of the comparator circuit according to the present invention.

FIG. 3 is a circuit diagram of the second embodiment of a comparator circuit according to the present invention. In this circuit, the dual inverter circuit shown in FIG. 2 is replaced with a resistance R1, and other components are identical with those in the first embodiment, so that the explanation about the configuration and the operation is herein omitted.

Also in this circuit, as same as the circuit shown in FIG. 2, due to the delay operation of the clock signal CLK by the resistance R1, the operation of the transistor M10 is delayed, so that it is possible to secure a time for making the voltage level amplified by the differential amplifier having the current mirror load. This results in having an advantage identical to the first embodiment.

Third Embodiment

Figure 4A:
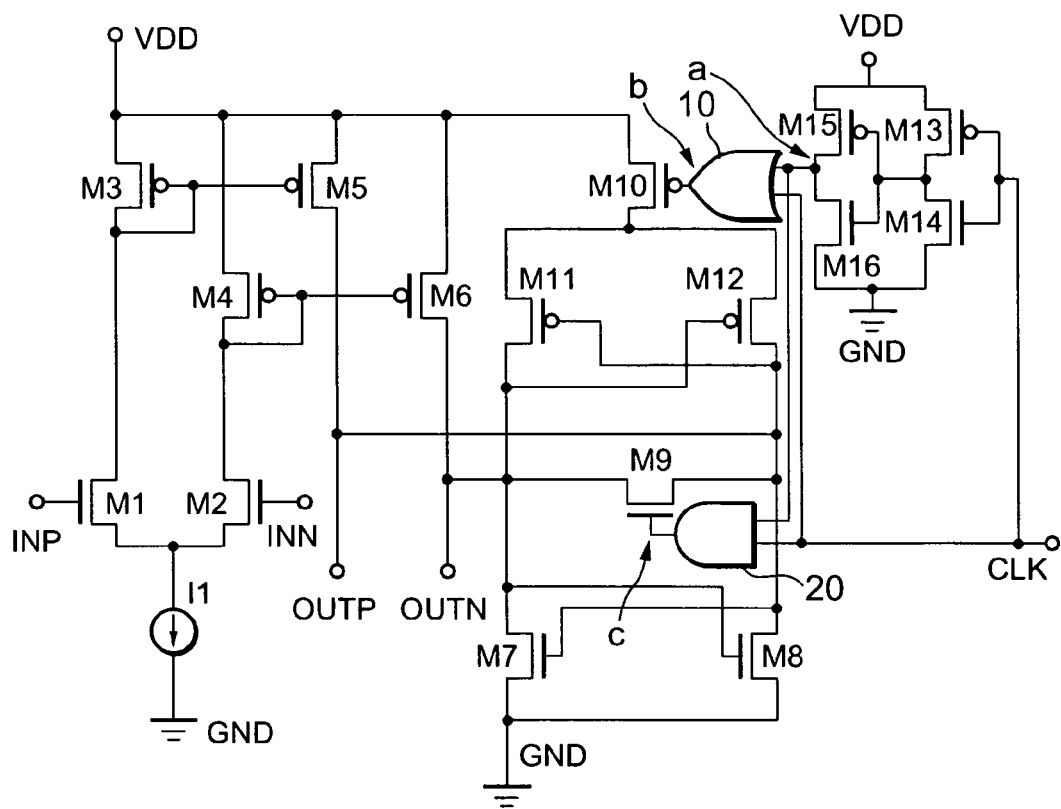
FIG. 4A is a circuit diagram showing a third embodiment of the comparator circuit according to the present invention.

FIG. 4A is a circuit diagram of the third embodiment of a comparator circuit according to the present invention. In this circuit, a two input OR gate circuit is disposed between the dual inverter circuit in FIG. 2 and the transistor M10, an output signal of the dual inverter (the delayed clock signal CLK) is inputted in one input terminal, and the clock signal CLK is inputted in other input terminal. In addition, a two input AND gate is disposed, whereby, without directly applying the clock signal CLK to the gate electrode of the transistor M9, the clock signal CLK is inputted in one terminal, and an output signal of the dual inverter is inputted in other input terminal. Other components are identical with the first embodiment.

Figure 4B:
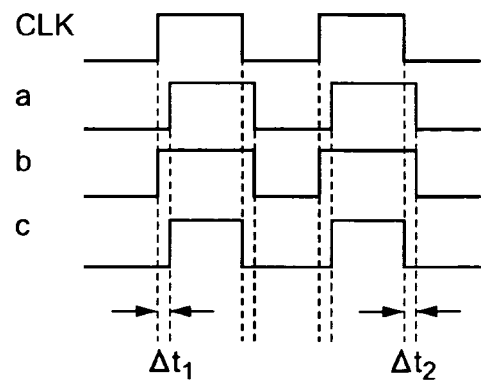
FIG. 4B is a timing chart showing wave forms of respective parts in FIG. 4A.

According to this configuration, as shown in FIG. 4B, after a signal b of the gate electrode of the transistor M10 rises, a gate signal c of the transistor M0 may rise behind Δt2, and after the gate signal c of the transistor M9 is lowered, the gate signal b of the transistor M10 is lowered behind Δt2, so that no through current passes through the latch circuit. Other advantages are identical to the first embodiment.

Fourth Embodiment

Figure 5:
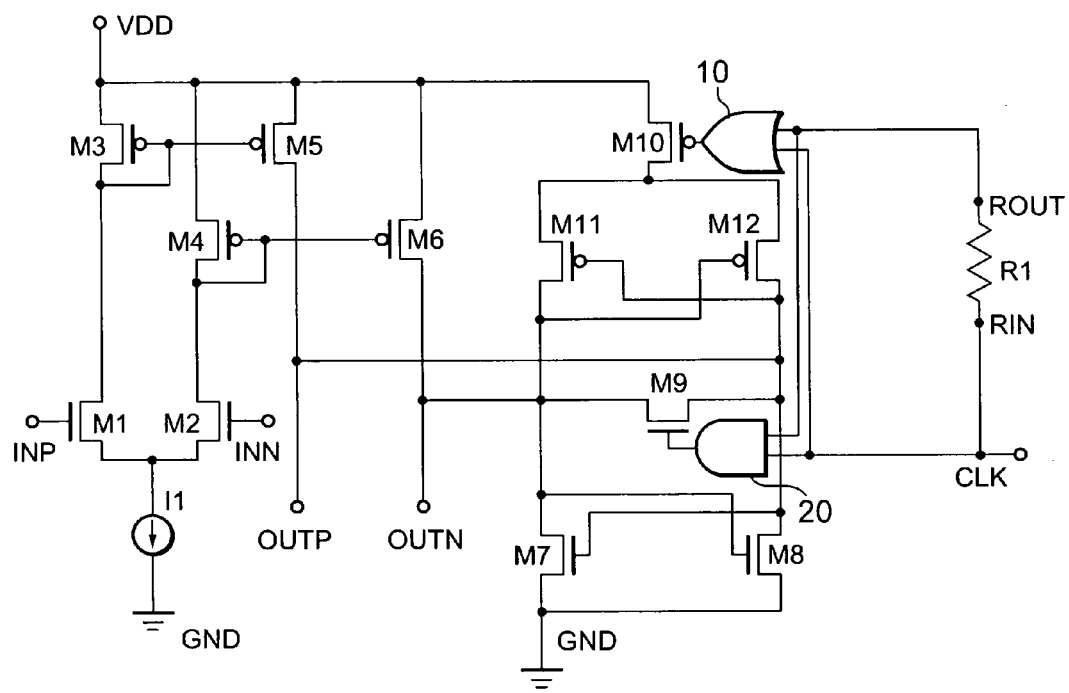
FIG. 5 is a circuit diagram showing a fourth embodiment of the comparator circuit according to the present invention.

FIG. 5 is a circuit diagram of the fourth embodiment of a comparator circuit according to the present invention. In this circuit, the dual inverter circuit in the circuit shown in FIG. 4A is replaced with the resistance R1. Due to this resistance R1, the clock signal CLK is delayed as same as the dual circuit, and this makes the operation of this circuit identical with the operation of the circuit in FIG. 4A. Accordingly, the circuit according to the fourth embodiment has the same advantages as the circuit shown in FIG. 4A.

What is claimed is:

1. A comparator circuit comprising:
a differential amplification circuit including a differential pair transistor for inputting a signal as an object of comparison, and a current mirror load circuit;
a latch circuit including inversion amplifiers that are configured so that an input of one amplifier becomes an input of other amplifier so as to amplify a differential output signal outputted from said current mirror load circuit in accordance with a magnitude relation of said signal as the object of comparison;
an equalization transistor for equalizing a signal of said differential amplification circuit;
a delay circuit for generating a signal to delay a control signal to be inputted in a control electrode of said equalization transistor; and
a control transistor for inputting an output signal of said delay circuit in the control electrode as a control signal to make said latch circuit into an active status and a non-active status.

2. The comparator circuit according to claim 1,
wherein said delay circuit comprises an inverter circuit.

3. The comparator circuit according to claim 1,
wherein said delay circuit comprises a resister element.

4. The comparator circuit according to claim 1,
wherein, in said differential amplification circuit, said differential pair includes first conductive transistors (M1, M2) connecting a common-connected source electrode to a constant current source; said current mirror load circuit includes second conductive transistors (M3, M4), which are connected to drain electrodes of said transistors (M1, M2), respectively, and to which drains and gates are connected, and second conductive transistors (M5, M6), of which gates are connected to the gates of said second conductive transistors (M3, M4) with each other; and
a comparison result signal is outputted from each drain electrode of said second conductive transistors (M5, M6).

5. A comparator circuit comprising:
a differential amplification circuit including a differential pair transistor for inputting a signal as an object of comparison, and a current mirror load circuit;
a latch circuit including inversion amplifiers that are configured so that an input of one amplifier becomes an input of other amplifier so as to amplify a differential output signal outputted from said current mirror load circuit in accordance with a magnitude relation of said signal as an object of comparison;

an equalization transistor for equalizing a signal of said differential amplification circuit;

a delay circuit for generating a delay control signal to delay a control signal so as to control said equalization transistor;

a logical circuit for outputting a logical multiplication signal of said delay control signal and said control signal as a control signal of said equalization transistor; and a control transistor for inputting a logical addition signal of said delay control signal and said control signal in the control electrode as a control signal to make said latch circuit into an active status and a non-active status.

6. The comparator circuit according to claim 5, wherein said delay circuit comprises an inverter circuit.

7. The comparator circuit according to claim 5, wherein said delay circuit comprises a resister element.

8. The comparator circuit according to claim 5, wherein, in said differential amplification circuit, said differential pair includes first conductive transistors (M1, M2) connecting a common-connected source electrode to a constant current source; said current mirror load circuit includes second conductive transistors (M3, M4), which are connected to drain electrodes of said transistors (M1, M2), respectively, and to which drains and gates are connected, and second conductive transistors (M5, M6), of which gates are connected to the gates of said second conductive transistors (M3, M4) with each other; and a comparison result signal is outputted from each drain electrode of said second conductive transistors (M5, M6).

* * * * *